United States Patent [19]

Tanaka

[11] Patent Number: 5,284,520
[45] Date of Patent: Feb. 8, 1994

[54] ELECTROLESS PLATING DEVICE

[75] Inventor: Atsushi Tanaka, Amagasaki, Japan

[73] Assignee: Mitsubishi Denki Kabushiki Kaisha, Tokyo, Japan

[21] Appl. No.: 913,586

[22] Filed: Jul. 14, 1992

[30] Foreign Application Priority Data

Aug. 2, 1991 [JP] Japan ................... 3-194080

[51] Int. Cl.$^5$ .................................................. B05C 3/00
[52] U.S. Cl. ...................... 118/600; 118/429; 427/430.1; 427/443.1; 134/102.1
[58] Field of Search ...................... 118/429, 600; 427/430.1, 432, 437, 443.1; 204/277; 134/102.1; 68/183

[56] References Cited

U.S. PATENT DOCUMENTS

| | | | |
|---|---|---|---|
| 2,396,578 | 3/1946 | Kittel et al. | 118/429 |
| 3,233,584 | 2/1966 | Angstadt | 118/429 |
| 3,348,969 | 10/1967 | Katz | 427/443.1 |
| 4,356,076 | 10/1982 | Matsushita et al. | 204/277 |
| 4,532,887 | 8/1985 | Fosterling | 118/429 |
| 4,865,888 | 9/1989 | Akahoshi | 427/443.1 |

FOREIGN PATENT DOCUMENTS 63-312983 of 1988 Japan.

*Primary Examiner*—W. Gary Jones
*Assistant Examiner*—Todd J. Burns
*Attorney, Agent, or Firm*—Wolf, Greenfield & Sacks

[57] ABSTRACT

An electroless plating device which comprises an electroless plating tank for accommodating an electroless plating solution; a draft pipe provided in the electroless plating tank for blowing air into the electroless plating solution; and a shield plate having perforations provided between an object of plating and bubbles blown out from the draft pipe, a size of each of said perforations being of dimensions whereby the bubbles cannot pass through the perforations.

4 Claims, 4 Drawing Sheets

ELECTROLESS PLATING DEVICE

BACKGROUND OF THE INVENTION

1. Field of the Invention

The present invention relates to an electroless plating device which is utilized in performing electroless plating, and particularly to an electroless plating device capable of uniformly depositing material for plating.

2. Discussion of Background

Conventionally, in performing the electroless plating, air is blown into a plating solution for the purpose of preventing self-decomposition of the plating solution.

As such an electroless plating device, a device is known which is described in, for instance, Japanese Unexamined Publication No. 312983/1988. A front view of the device described in the publication is shown in FIG. 4.

In FIG. 4, a reference numeral 1 designates an electroless plating tank for accommodating an electroless plating solution 6, 2, a draft pipe for blowing bubbles into the electroless plating solution 6, 3, bubbles (air), and 4, an object for plating. In the electroless plating device having such a construction, the electrolytic plating solution 6 is provided in the electroless plating tank 1, of which temperature is maintained at a predetermined temperature. Next, air is blown from a draft pipe 2 into the electroless plating solution 6. The object for plating 4 is immersed in the electroless plating solution, thereby performing the plating.

However, in the conventional electroless plating device, since blowing-out openings of the draft pipe 2 are provided at the bottom side of the object for plating 4, the bubbles 3 blown out from the blowing-out opening contact the object for plating 4. Since the electroless plating solution 6 does not contact the object for plating 4 at a portion thereof contacting the bubbles 3, a material for plating is not deposited at the portion contacting the bubbles 3. Furthermore, at the portion contacting the bubbles 3 wherein the material for plating is not deposited, the surface of the object for plating 4 is oxidized. Accordingly, the material for plating is not deposited at the portion hereinafter, the deposition of the material for plating becomes nonuniform.

SUMMARY OF THE INVENTION

It is an object of the present invention to solve the above problem. It is an object of the present invention to provide an electroless plating device capable of achieving the uniform deposition of material for plating.

According to an aspect of the present invention, there is provided an electroless plating device which comprises:

an electroless plating tank for accommodating an electroless plating solution;

a draft pipe provided in the electroless plating tank for blowing air into the electroless plating solution; and a shield plate having perforations provided between an object of plating and bubbles blown out from the draft pipe, a size of each of said perforations being of dimensions whereby the bubbles cannot pass through the perforations.

According to the shield plate in the electroless plating device of this invention, the bubbles blown out from the draft pipe are prevented from directly contacting the object for plating, by which depositability of the material for plating on the object for plating can be uniform. At this occasion, since the perforations are formed on the shield plate, the flow (diffusion) of the plating solution is not blocked.

DETAILED DESCRIPTION OF THE PREFERRED EMBODIMENTS

A detailed explanation will be given to an electroless plating device (hereinafter, plating device) based on the attached drawings.

Figure 1:
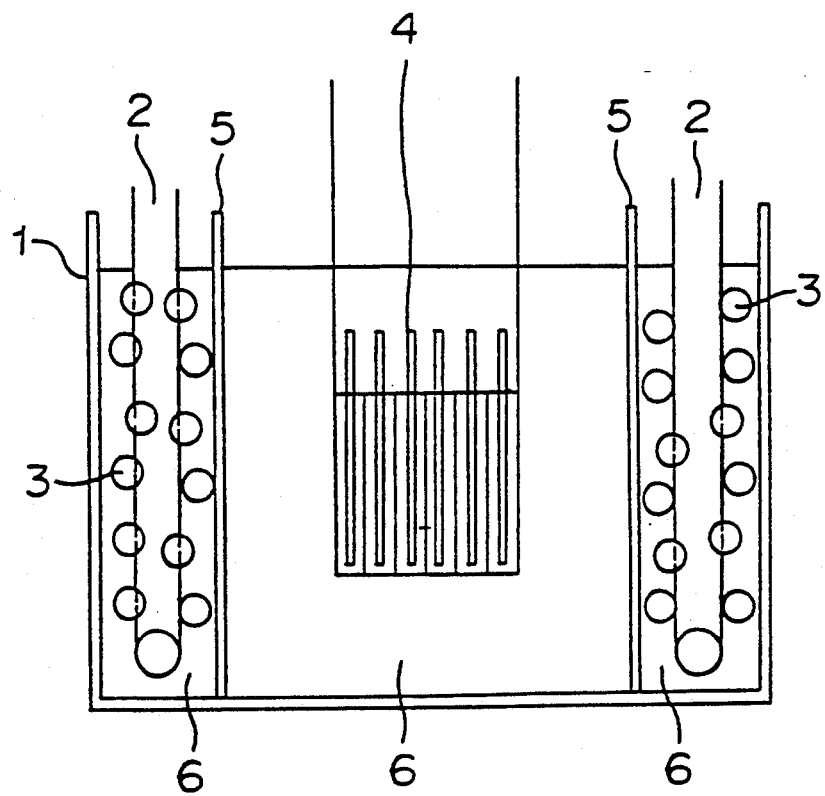
FIG. 1 is an explanatory front view of an embodiment of an electroless plating device according to the present invention.
Figure 2:
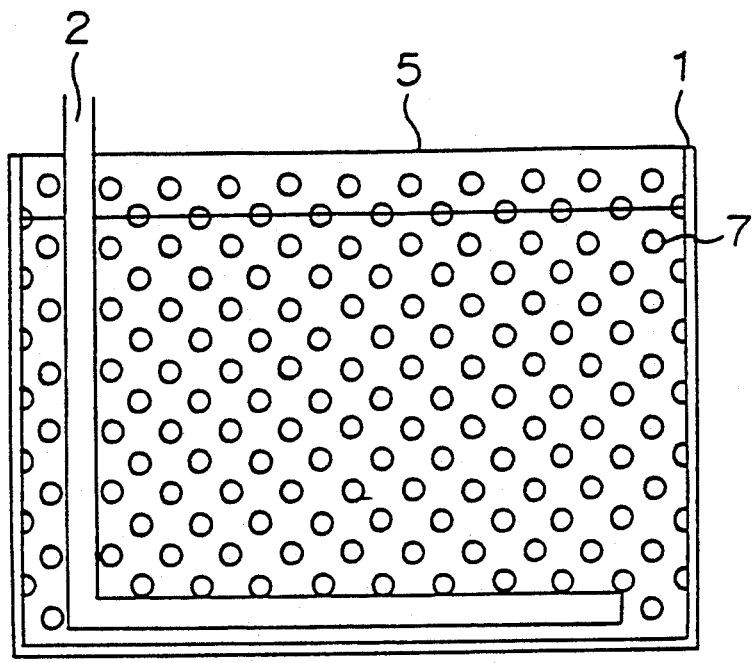
FIG. 2 is an explanatory side view of the electroless plating device shown in FIG. 1.

FIG. 1 is an explanatory front view of an embodiment of a plating device according to the present invention, and FIG. 2, an explanatory side view of the plating device shown in FIG. 1. To facilitate understanding thereof, bubbles and perforations 7 are exaggeratingly described.

In FIGS. 1 and 2, a reference numeral 1 designates an electroless plating tank for accommodating an electroless plating solution 6, and 2, a draft pipe for blowing air into the electroless plating solution 6, provided in the electroless plating tank 1. A plurality of perforations are provided at pertinent intervals on the draft pipe 2. Air supplied from an air supply source (not shown) such as an air pump, is blown out from the perforations into the electroless plating solution 6. Although the size or the pitch of the perforations provided on the draft pipe 2, is not especially restricted in this invention, the perforations of a size of about 1 to 3 mm are normally provided at an interval of about 2 to 5 mm.

A reference numeral 3 designates bubbles blown out from the draft pipe 2, and 4, an object for plating such as a printed board.

The characteristic of the present invention is that a shield plate 5 is provided between the object for plating 4 and the bubbles 3 blown out from the draft pipe 2. The shield plate 5 is provided with the perforations 7, the size of each of which is of dimensions whereby the bubbles 3 cannot pass through the perforations. The perforations 7 can prevent the contact of the object for plating 4 with the bubbles 3, thereby enabling a uniform deposition of the material for plating on the object for plating 4. Furthermore, since the shield plate 5 is provided with a great number of the perforations 7, flow of the plating solution between the bubble generating unit and a unit of the object for plating 4, is not prevented, and nonuniformity is not caused in the composition of the plating solution or in the air concentration in the plating solution.

The shield plate 5 is made of a material which is stable in the plating solution and the material for plating is not deposited on it. A metal plate or a plastic plate provided with the perforations 7 the shape of which is a circle having a diameter smaller than those of the bubbles, can be utilized. A metal or an alloy which is inactive in the electroless plating solution, such as stainless steel or titanium can be used for the metal plate. Furthermore, as the plastic plate, a plate can be utilized which resists the electroless plating solution, made of acrylate resin, polyvinyl chloride resin, teflon resin, polypropylene resin or the like.

The shape of the perforations 7 of the shield plate 5 is not restricted to a circle. Any shape will do so far as passing-through of the bubbles 3 can be prevented. For instance, perforations having a shape of ellipse, rectangle or the like, at least a length in a direction of which is smaller than the diameters of the bubbles, can be adopted.

Furthermore, as the shield plate 5, other than a so-called plate-like object composed of one sheet, a metal sheet having the perforations as stated above, or a construction wherein a mesh or a cloth is expanded in a frame member, made of a plastics which resists the electroless plating solution, such as polyvinyl chloride resin, acrylate resin, teflon resin, polypropylene resin or the like, can be adopted. The above metal is preferably coated with a resin such as a teflon resin so that the material for plating is not deposited on it. In that case, a metal which is active in the electroless plating solution, for instance, copper, iron, aluminum, or the like, can be utilized. In this specification, "cloth" is a general concept incorporating a knitting, a nonwoven fabric or the like other than a textile.

Figure 3:
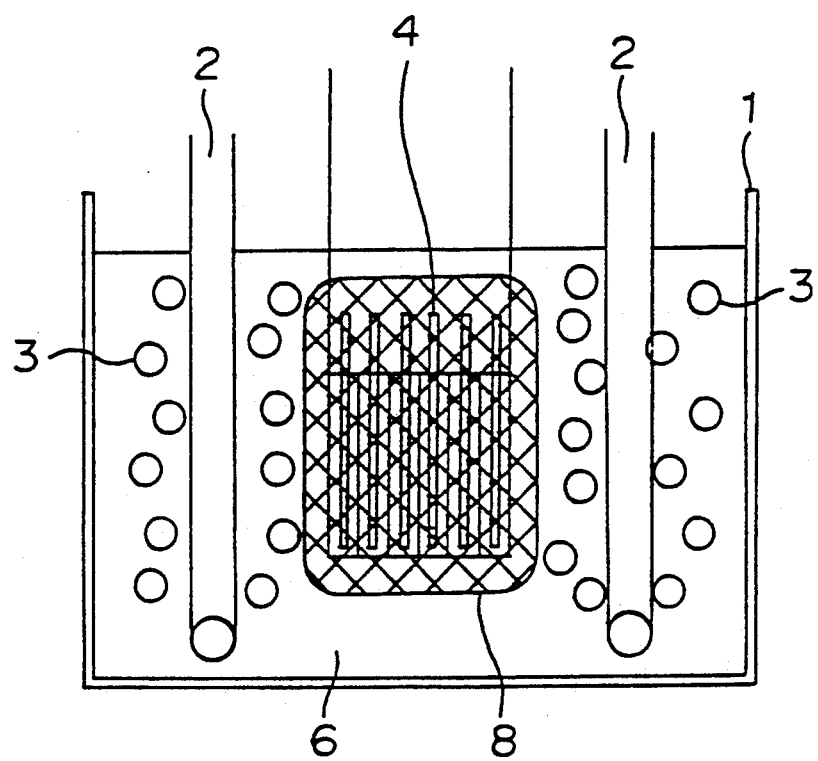
FIG. 3 is an explanatory front view of another embodiment of an electroless plating device according to the present invention.
Figure 4:
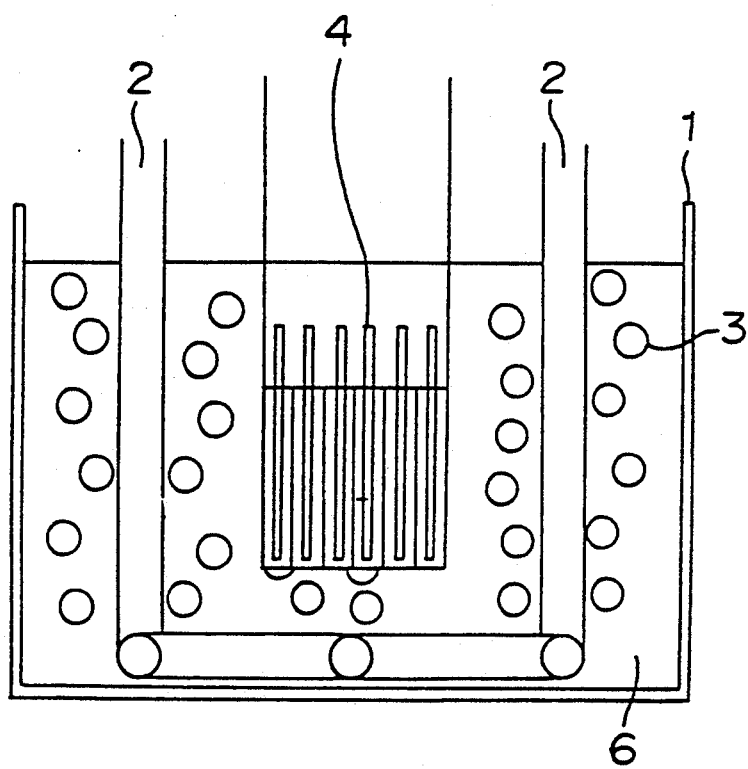
FIG. 4 is an explanatory front view of a conventional electroless plating device.

FIG. 3 shows another embodiment wherein the bubbles 3 are prevented to contact the object for plating 4. In the embodiment shown in FIG. 3, the cloth utilized in the preceding embodiment, is formed into a shape of a bag designated by a reference numeral 8, which contains and covers up the object for plating. It is necessary to arrange the bag so that the bag does not touch the object for plating. By this arrangement, similar to the preceding example, the contact of the bubbles with the object for plating is prevented without blocking the flow of the plating solution, thereby enabling the uniform deposition of the material for plating.

As explained above, according to the plating device of this invention, since the shield plate is provided between the bubbles and the object for plating so that the direct contact thereof is prevented, the material for plating is stably deposited, and the plating can accurately be performed.

What is claimed is:

1. An electroless plating device which comprises:
   an electroless plating tank for accommodating an electroless plating solution; a workpiece holder for holding an object of plating;
   a draft pipe provided in the electroless plating tank for blowing air into the electroless plating solution to form bubbles; and
   a shield plate having perforations provided between the object of plating and the bubbles blown out from the draft pipe, a size of each of said perforations being of dimensions whereby the bubbles can not pass through the perforations.

2. The electroless plating device according to claim 1, wherein the shield plate comprises a metal plate or a plastic plate having perforations, at least a dimension of each of said perforations being smaller than diameters of the bubbles blown out from the draft pipe into the electroless plating solution.

3. The electroless plating device according to claim 1, wherein the shield plate comprises a mesh or a cloth expanded in a frame member made of a metal or a plastics, having perforations, at least a dimension of each of said perforations being smaller than diameters of the bubbles blown out from the draft pipe into the electroless plating solution.

4. An electroless plating device which comprises:
   an electroless plating tank for accommodating an electroless plating solution; a workpiece holder for holding an object of plating;
   a draft pipe provided in the electroless plating tank for blowing air into the electroless plating solution to form bubbles; and
   a cloth for covering up the object of plating without touching the object of plating, such that the bubbles cannot pass through the cloth and reach the workpiece.

* * * * *